United States Patent [19]

Okubo et al.

[11] Patent Number: 5,744,011
[45] Date of Patent: Apr. 28, 1998

[54] SPUTTERING APPARATUS AND SPUTTERING METHOD

[75] Inventors: Michiko Okubo, Kawasaki; Naoyuki Inoue; Katsutaro Ichihara, both of Yokohama; Nobuaki Yasuda, Zushi, all of Japan

[73] Assignee: Kabushiki Kaisha Toshiba, Kawasaki, Japan

[21] Appl. No.: 634,134

[22] Filed: Apr. 19, 1996

Related U.S. Application Data

[63] Continuation of Ser. No. 208,521, Mar. 11, 1994, abandoned.

[30] Foreign Application Priority Data

Mar. 18, 1993 [JP] Japan ................................. 5-058568
Sep. 21, 1993 [JP] Japan ................................. 5-235039

[51] Int. Cl.$^6$ .................................................. C23C 14/34
[52] U.S. Cl. .............................. 204/192.12; 204/298.16; 204/298.17; 204/298.18; 204/298.19; 204/298.2
[58] Field of Search ........................... 204/192.1, 192.12, 204/298.06, 298.07, 298.09, 298.16, 298.17, 298.18, 298.19, 298.2

[56] References Cited

U.S. PATENT DOCUMENTS

| | | | |
|---|---|---|---|
| 3,956,093 | 5/1976 | McLeod | 204/298.2 |
| 4,401,539 | 8/1983 | Abe et al. | 204/298.2 |
| 4,404,077 | 9/1983 | Fournier | 204/298.19 |
| 4,761,218 | 8/1988 | Boys | 204/298.19 |
| 4,853,102 | 8/1989 | Tateishi et al. | 204/298.16 |
| 4,871,433 | 10/1989 | Wagner et al. | 204/298.16 |
| 4,971,674 | 11/1990 | Hata | 204/192.12 |
| 5,196,105 | 3/1993 | Feuerstein et al. | 204/298.19 |
| 5,262,030 | 11/1993 | Potter | 204/298.2 |

FOREIGN PATENT DOCUMENTS

| | | | |
|---|---|---|---|
| 57-207173 | 12/1982 | Japan | 204/298.16 |
| 58-171569 | 10/1983 | Japan | . |
| 2-232358 | 9/1990 | Japan | . |
| 4-318165 | 11/1992 | Japan | . |

*Primary Examiner*—R. Bruce Breneman
*Assistant Examiner*—Rodney G. McDonald
*Attorney, Agent, or Firm*—Finnegan, Henderson, Farabow, Garrett & Dunner, L.L.P.

[57] ABSTRACT

In a film forming vessel, a substrate destined to carry on the surface thereof a thin film to be formed and a magnetron sputtering source integrally composed of an electric field supply means and a main magnetic field supply means for forming magnetron plasma in the neighborhood of the target and concurrently serving as a target holder for retaining a target in place are disposed as opposed to each other. An electromagnet as an auxiliary magnetic field supply means for decreasing the spatially dispersed amount of magnetron plasma in the neighborhood of the surface of the substrate is also laid out in the film forming vessel. A thin film of compound, for example, is formed on the substrate, with the spatially dispersed amount of magnetron plasma in the neighborhood of the surface of the substrate decreased as described above. As a result, the thin film of excellent quality is formed with high repeatability on a large surface area.

12 Claims, 11 Drawing Sheets

SPUTTERING APPARATUS AND SPUTTERING METHOD

This application is a continuation of application Ser. No. 08/208,521 filed Mar. 11, 1994, now abandoned.

BACKGROUND OF THE INVENTION

1. Field of the Invention

This invention relates to a sputtering apparatus for forming a thin film of compound, for example, on the surface of a substrate by utilizing the phenomenon of magnetron sputtering and a method for effecting this sputtering.

2. Description of the Related Art

The method for forming a thin film of varying compound on the surface of a given substrate by utilizing the phenomenon of sputtering has been finding extensive utility because it permits the film to be formed quickly by the use of a apparatus of rather simple construction. This sputtering method is at an immense advantage over the CVD method in permitting the formation of a thin film of varying quality even under the conditions involving a low substrate temperature (such as, for example, the level not exceeding 400° C.). This low-temperature film-forming property is conspicuously manifested particularly in the operation of the magnetron sputtering method. This method can be effectively applied even to resin substrates which are capable of only low resistance to heat and, therefore, is expected to find utility in a wide range of applications.

The magnetron sputtering method comprises supplying to the neighborhood of a sputtering source a magnetic field (B) which is perpendicular to an electric field (E) thereby moving the electrons in a plasma in the direction of E×B and consequently containing the plasma in the areas of the neighborhood of the sputtering source and repressing the otherwise inevitable rise of the substrate temperature. As supplementary effects of the magnetron sputtering method, the capability of this method to produce a thin film of excellent quality due to the sparingness of entrapment of impurities because of the operability of the method under a lower gas pressure than usual, the capability of the method to increase the density of ion injection onto the sputtering source owing to the inclination of the plasma to be concentrated in the neighborhood of the sputtering source, and the capability of the method to exalt the sputtering rate as a natural consequence may be cited.

Since the electric field E and the magnetic field B cannot be easily applied uniformly over a large area, however, the distribution of magnetron discharge is non-uniform and, as a result, the amount of the plasma flowing into the substrate has a distribution of certain pattern. Owing to this distribution of the amount of plasma, the stationary opposition type magnetron sputtering method is at a disadvantage in rendering it difficult to form a thin film of uniform quality on a large area. Even in the case of a sputtering method such that the substrate under treatment is either relatively or positively moved past or round the site of sputtering, the problem arises that the thin film to be formed thereby is liable to betray non-uniformity of quality in the direction of thickness. This trend is conspicuous in the thin film of compound which is formed by the reactive sputtering method using oxygen or nitrogen, i.e. a gas exhibiting affinity for electrons. This is because the stream of plasma flowing into the substrate contains the negative ions and radicals originally entrained by the reactive gas and the negative ions and radicals affect the quality of film in a great measure.

SUMMARY OF THE INVENTION

It is an object of this invention, therefore, to provide a sputtering apparatus which precludes the non-uniformity of film quality observed in the thin film of compound formed by the conventional magnetron sputtering method and permits a thin film of excellent quality to be formed with high repeatability on a large surface area. Another object of this invention is to provide a sputtering method which allows a thin film of ideal quality to be produced with high repeatability on a large surface area.

The sputtering apparatus of this invention is characterized by comprising a film forming vessel having a gas supply system and a discharge system communicating with each other, said vessel allowing placement therein of a target and a material on which a thin film formed of a substance of said target is to be formed; electric field supply means for supplying an electric field for forming magnetron plasma in the neighborhood of said target; main magnetic field supply means for supplying a main magnetic field contributing to the formation of said magnetron plasma; and auxiliary magnetic field supply means for supplying an auxiliary magnetic field for decreasing the spatially dispersed amount of said magnetron plasma in the neighborhood of the surface of said material.

The sputtering method of this invention is characterized by comprising the steps of: disposing inside a film forming vessel having a gas supply system and a discharge system communicating with each other a target and a material on which a thin film formed of a substance of said target is to be formed; setting the interior of said film forming vessel at a prescribed gas atmosphere and supplying an electric field and a main magnetic field in the neighborhood of said target thereby inducing generation of magnetron plasma inside said film forming vessel; and supplying an auxiliary magnetic field in the interior of said film forming vessel thereby decreasing the amount of spatially dispersed said magnetron plasma in the neighborhood of the surface of said material.

Besides the main magnetic field supply means forming magnetron plasma, the sputtering apparatus of this invention is provided with auxiliary magnetic field supply means which is capable of decreasing the spatially dispersed amount of magnetron plasma in the neighborhood of the surface of the material, namely averaging the amount of the plasma flowing into the surface of the material. After experiments, the present inventors have been ascertained that, by a rather simple method of causing the magnetic field parallel to the surface of the target generated by the main magnetic field supply means to be moved in the direction parallel to the surface of the target, the amount of plasma in the neighborhood of the material can be averaged without requiring the magnetic fields formed in numerous directions inside the film forming vessel to be wholly uniformized. In other words, the sputtering apparatus of this invention is provided with means for moving the magnetic field parallel to the surface of the target generated by the main magnetic field supply means in the direction parallel to the target surface. In accordance with the sputtering method of this invention which is operated as described above, the aforementioned averaging of the amount of plasma serves the purpose of precluding the inconstancy of quality such as is observed in the conventional thin film of compound and permitting a thin film of excellent quality to be formed with high repeatability on a large surface area.

DESCRIPTION OF THE PREFERRED EMBODIMENTS

Now, this invention will be described more specifically below with reference to working examples.

Figure 1:
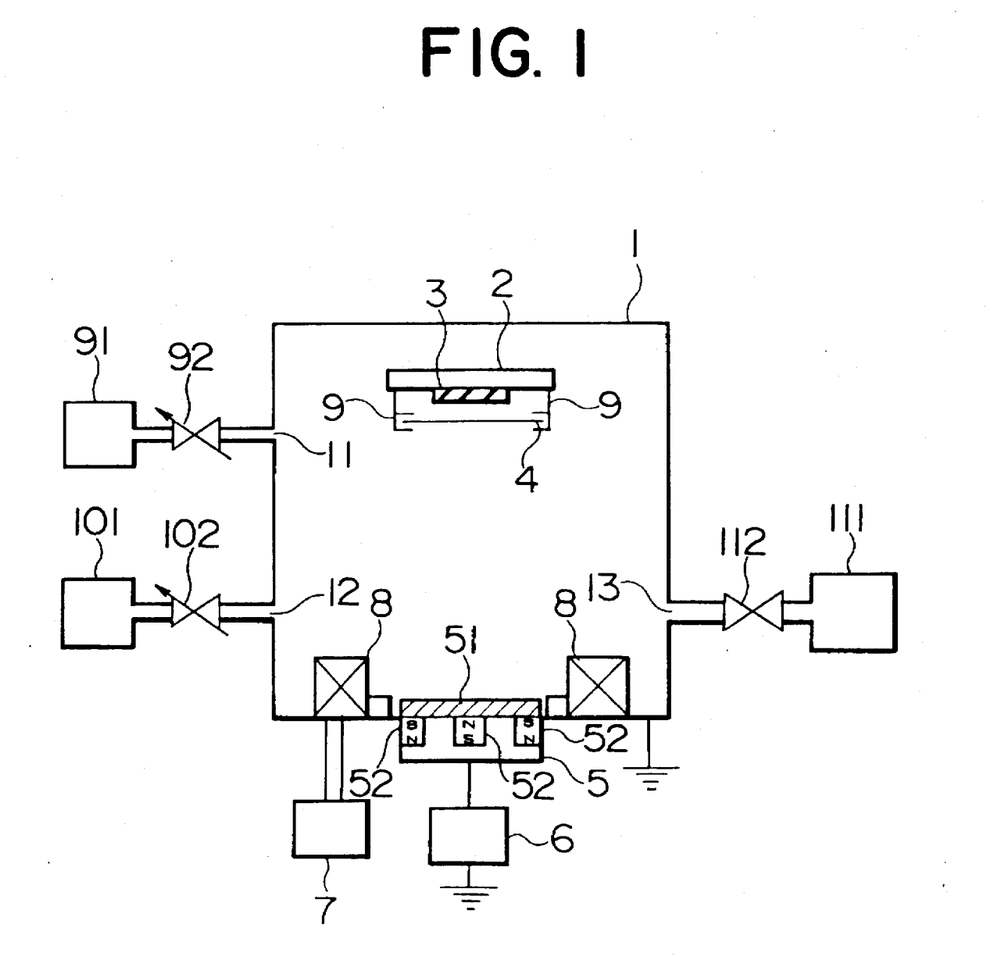
FIG. 1 is a cross section illustrating schematically the construction of a sputtering apparatus as a first embodiment of this invention.

FIG. 1 is a diagram illustrating schematically the construction of a sputtering apparatus of the type of parallel plates according with the first embodiment of this invention. In the diagram, a film forming vessel represented by 1 is provided on one lateral side thereof with two gas inlet ports 11 and 12. The film forming vessel 1 is provided on the other lateral side thereof with a gas discharge port 13. The gas inlet port 11 is connected to a reactive gas supply system 91. From the reactive gas supply system 91, a reactive gas is supplied into the film forming vessel 1 via a conductance valve 92 for adjusting the amount of supply. The gas inlet port 12 is connected to an Ar gas supply system 101. From the Ar gas supply system 101, An Ar gas is supplied into the film forming vessel 1 via a conductance valve 102 for adjusting the amount of supply. The gas discharge port 13 is connected to a discharge system 111. The discharge system 111 serves to discharge the gas from within the film forming vessel 1 via a discharge system valve 112.

In the upper part of the interior of the film forming vessel 1, a material holder 2 for retaining a material destined to have a thin film formed on the surface thereof is disposed in an electrically suspended state with the aforementioned surface held horizontally. On the lower side of the material holder 2, a substrate 3 subjected to the material is supported. In front of the substrate 3, a shutter 4 is set in place in an electrically suspended state so as to be selectively opened and shut by sliding a shutter fixing base 9 relative thereto. In the bottom part of the film forming vessel 1, a magnetron sputtering source 5 integrally combining electric field supply means and main magnetic field supply means is disposed as opposed to the substrate 3. The magnetron sputtering source 5 is adapted to be driven with a DC power source 6. The magnetron sputtering source 5 concurrently serves as a target holder for retaining in place a target 51. The electric field generated from the magnetron sputtering source 5 is in the direction from the substrate 3 to the target 51. The density of the electric power projected on the target surface is set in the range of 0.4 to 1.0 W/cm$^2$, for example.

Around the magnetron sputtering source 5, an electromagnet 8 having an AC power source or a DC power source 7 connected thereto is set in place as a auxiliary magnetic field supply means. This electromagnet 8 is so adapted that the direction and intensity of the magnetic field generated from the electromagnet 8 will be freely varied with the electric current applied to the electromagnet 8.

Figure 2:
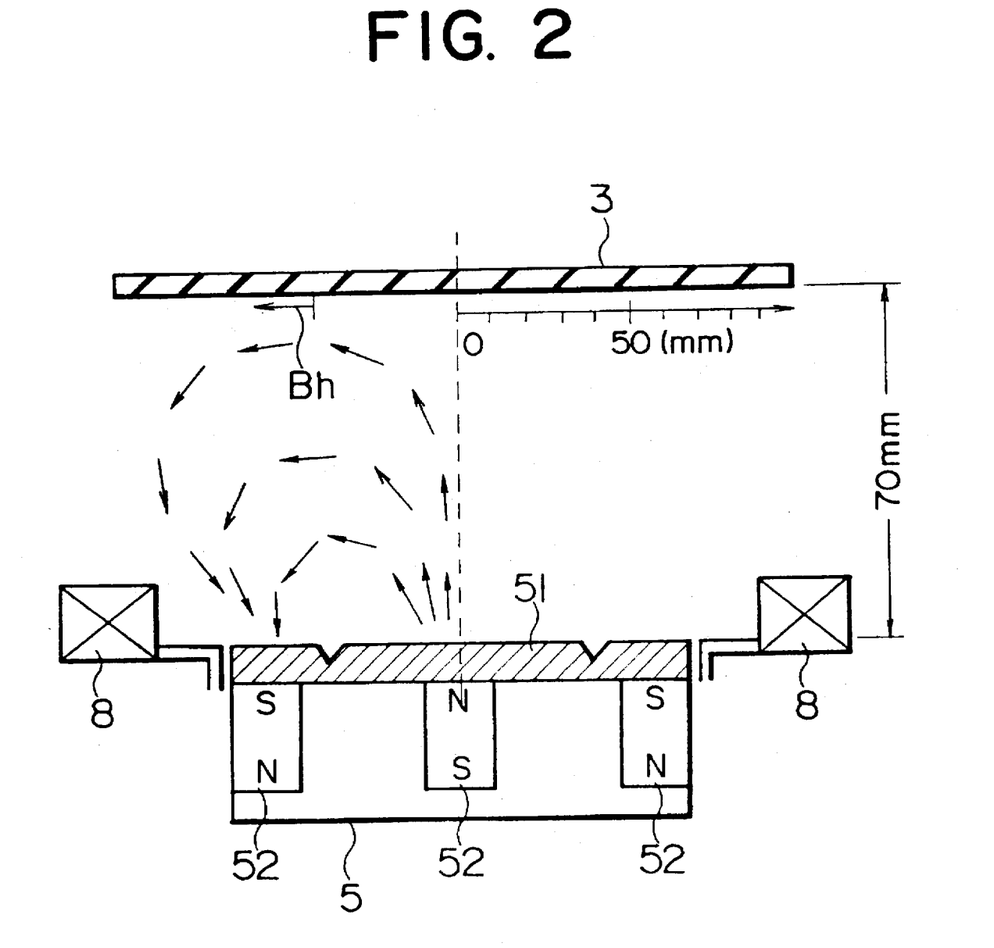
FIG. 2 is a diagram illustrating the construction of the essential part of the sputtering apparatus shown in FIG. 1 and also showing the directions of magnetic fields.

FIG. 2 shows with arrows the directions of magnetic fields which are formed between the magnetron sputtering source 5 and the substrate 3 such as, for example, a glass substrate in the sputtering apparatus illustrated in FIG. 1. The magnetic field in this case is generated from permanent magnets 52 which are set in place beneath the target 51. In the diagram, $B_h$ stands for a parallel magnetic field parallel to the target 51 surface and the substrate 3 surface on the surface of the substrate 3. The position at which the parallel magnetic field $B_h$ is generated on the surface of the substrate 3 is decided by such factors as the strength of the permanent magnet 52. In the apparatus of this embodiment, the intensity of the parallel magnetic field $B_h$ is 75 G and the position of the generation of the parallel magnetic field is 5.1 cm from the center of the substrate 3. The magnetic fields on the surface of the substrate 3 before and behind the parallel magnetic field $B_h$ are not parallel but oblique. The position of this parallel magnetic field $B_h$ on the surface of the substrate 3, however, can be controlled by suitably varying the intensity or direction of a magnetic field generated by the electromagnet 8. In other words, the magnetic fields severally generated by the electromagnet 8 and the permanent magnets 52 are combined and the resultant sum forms an overall magnetic field and the position of the parallel magnetic field $B_h$ is moved on the surface of the substrate 3 depending on the overall magnetic field. As a result, the distribution of plasma in proximity of the surface of the substrate 3 is proportionately varied and the spatially dispersed amount of plasma is decreased. Thus, the electromagnet 8 may well be regarded as means for moving the position of the parallel magnetic field $B_h$ in a direction parallel to the substrate surface, i.e. in a direction parallel to the target 51 surface.

Figure 3:
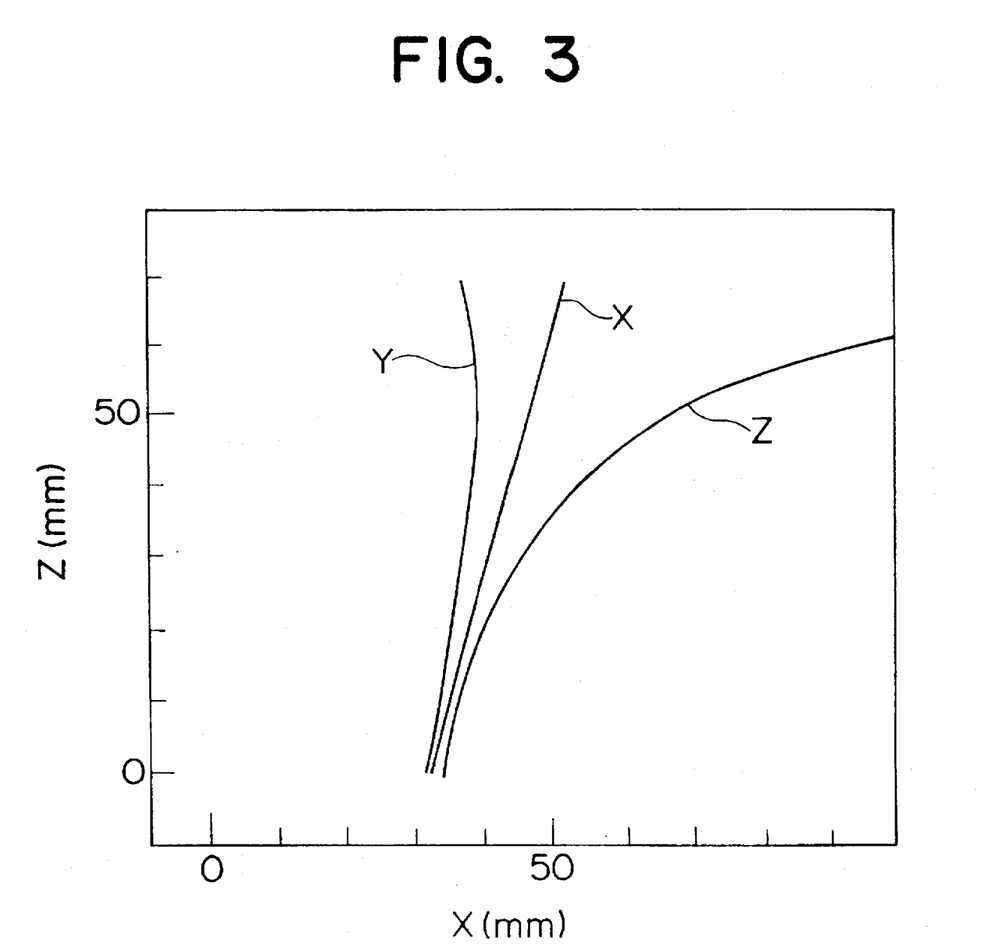
FIG. 3 is a diagram illustrating lines connecting positions at which sums of vectors severally of a main magnetic field and an auxiliary magnetic field are parallel to the surface of a target in comparison with a line of vector solely of a main magnetic field.
Figure 4:
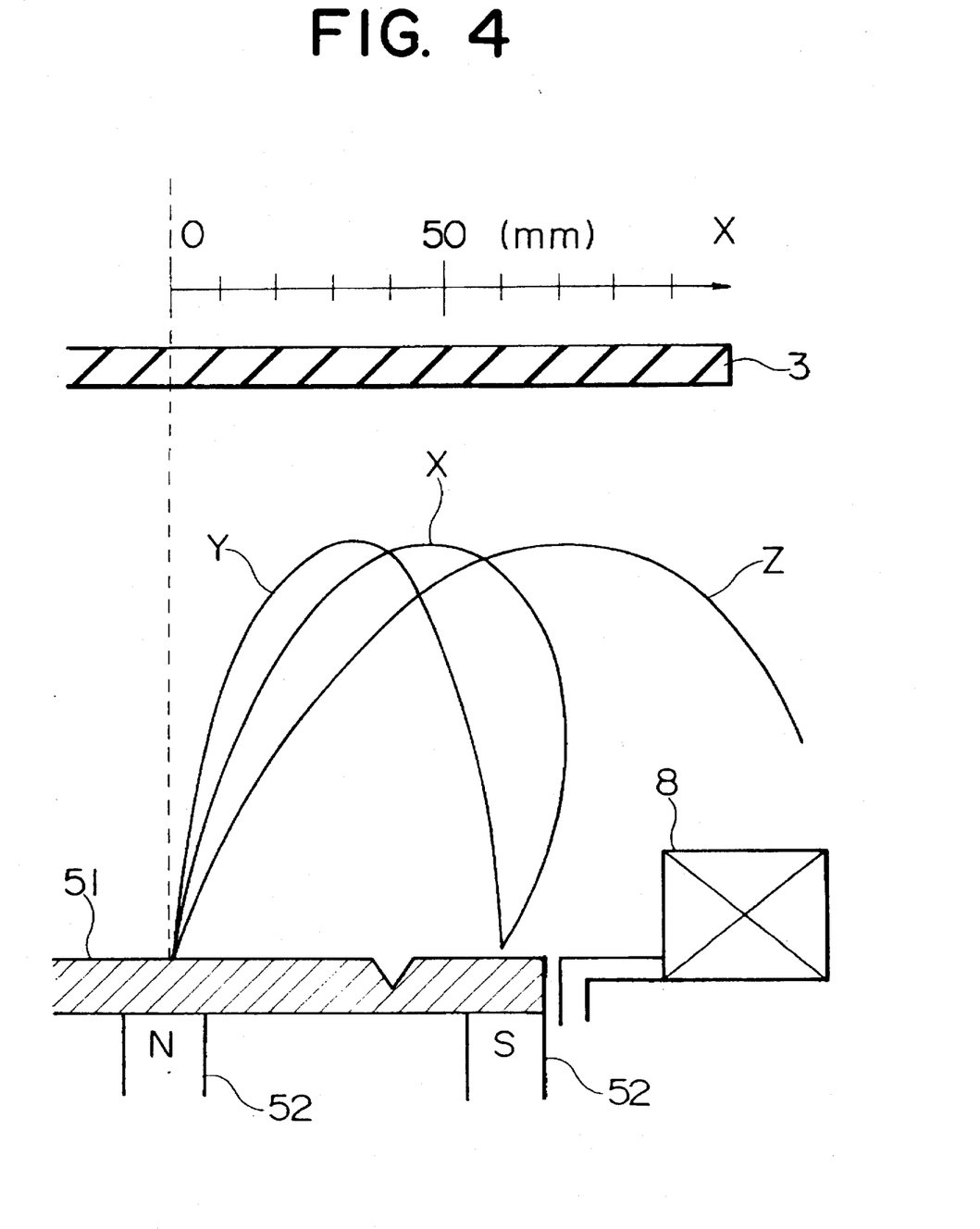
FIG. 4 is a diagram illustrating distribution of leak magnetic fields obtained in the combined use of a main magnetic field and an auxiliary magnetic field in comparison with a leak magnetic field obtained in the sole use of a main magnetic field.

FIG. 3 represents the lines connecting the positions at which the sums of vectors severally of a main magnetic field and an auxiliary magnetic field shown in FIG. 2 are parallel to the target 51 surface and the substrate 3 surface, with the distance (X) of line in the direction of the short axis of the target 51 taken in the horizontal axis and the distance (Z) of line in the direction of the substrate 3 from the target 51 taken in the vertical axis respectively of the graph. The electric field is applied in the approximately minus Z direction in the bearings of FIG. 3. The plasma which is formed in the neighborhood of the target 51 advances approximately along the lines shown in FIG. 3 and reaches the substrate 3 surface. In FIG. 3, the line X represents the results obtained by the sole application of the main magnetic field, the line Y the results obtained by the application of the main magnetic field plus the application of the auxiliary magnetic field for the sake of moving the plasma distribution in the neighborhood of the substrate 3 surface in the direction of the center of the substrate 3, and the line Z the results obtained by the application of the main magnetic field plus the application of the auxiliary magnetic field for the sake of moving the plasma distribution in the neighborhood of the substrate 3 in the direction of the outer side of the substrate 3. FIG. 4 is a diagram showing the distribution of leak magnetic fields obtained under the conditions of X, Y, and Z mentioned above. It is clearly noted from FIG. 3 and FIG. 4 that when the auxiliary magnetic field is applied in accordance with the present invention, the distribution of magnetic fields in the neighborhood of the target 51 is not substantially varied but the distribution of magnetic fields only in the neighborhood of the substrate 3 surface is varied. In accordance with the present invention, therefore, the distribution of plasma in the neighborhood of the substrate 3 surface can be exclusively varied substantially without affecting the distribution of plasma in the neighborhood of the target 51.

Figure 5:
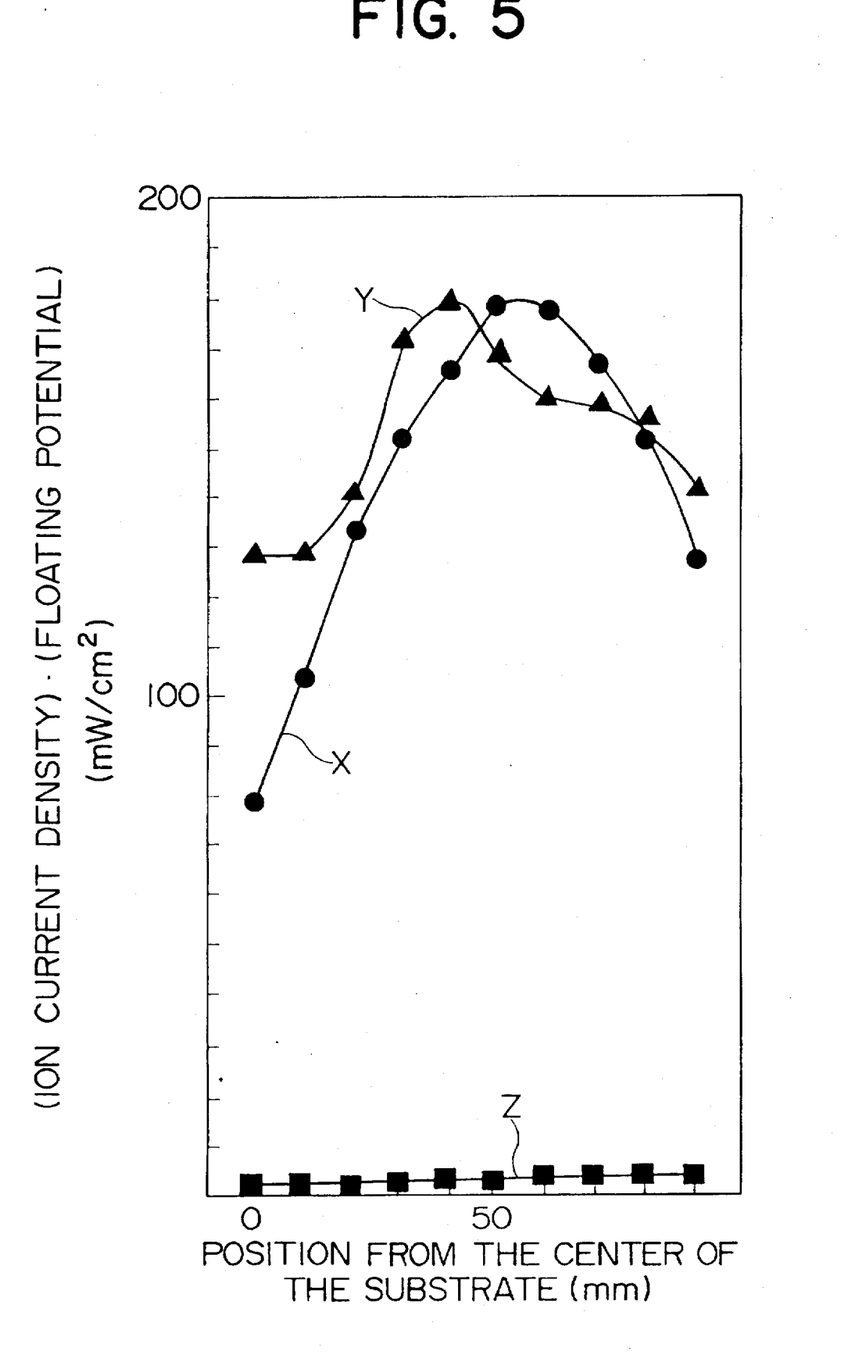
FIG. 5 is a diagram illustrating the relation between the amount of stream of plasma flowing into a substrate and the position of inflow of plasma from the center of the substrate as obtained in the combined use of a main magnetic field and an auxiliary magnetic field in comparison with the relation obtained in the sole use of a main magnetic field.

FIG. 5 is a diagram depicting the fact that the control of the distribution of magnetic fields shown in FIG. 3 and FIG. 4 results in a decrease in the spatially dispersed amount of plasma in the neighborhood of the substrate 3 surface. The amount of plasma is indicated by the product of ion current density of a given plasma multiplied by the floating potential also of the plasma actually measured with a probe installed in the proximity of the substrate 3. Since the ion current density is an amount proportionate to the plasma density and the floating potential is equal to the energy which such particles as ions in the plasma assume while they flow in the substrate 3 surface, the product of these two magnitudes equals the plasma particle flux density which flows in the substrate 3 surface. It is clearly noted from the diagram that when the application of the main magnetic field is made in addition to that of the auxiliary magnetic field (lines Y and Z) in contrast to such sole application of the main magnetic field as observed in the conventional practice (line X), the movement of the magnetic fields illustrated in FIG. 3 and FIG. 4 can simultaneously bring about a motion of the plasma distribution and a decrease of the spatially dispersed amount of plasma (width of distribution in the direction of the vertical axis in FIG. 5). It suffices for this invention, therefore, to make selective application of the auxiliary magnetic field (line Y) for moving the plasma distribution in the direction of the center of the substrate or the auxiliary magnetic field (line Z) for moving the plasma distribution in the direction of the outside of the substrate 3 so as to decrease the spatially dispersed amount of plasma depending on the conditions used for the formation of a thin film. Owing to the effect manifested in averaging the plasma distribution in the neighborhood of the surface of the substrate 3, this invention is enabled to render uniform the quality of the thin film to be formed on the surface of the substrate 3 as will be more specifically described hereinafter.

The magnetron sputtering apparatus which is provided in the neighborhood of a target used therein with a plurality of main magnetic fields capable of forming magnetron plasma for the sake of varying plasma distribution in proximity of the target and heightening the efficiency of utilization of the target has been known to the art. In a sense, this apparatus may well be regarded as being provided with a supplementary magnetic field supply means in addition to a main magnetic supply means. Indeed, this conventional apparatus is capable of varying the plasma distribution in the neighborhood of the target. It is, however, incapable of controlling the magnetic field distribution illustrated in FIG. 3 and FIG. 4 by the use of the supplementary magnetic field supply means mentioned above. This conventional apparatus, therefore, deviates from the main object of this invention which resides in decreasing the spatially dispersed amount of plasma in the neighborhood of the surface of the material (substrate).

In the sputtering apparatus of this invention, while the plasma distribution in the neighborhood of the surface of the material (substrate) is varied by the application of the auxiliary magnetic field as described above, the plasma distribution in the neighborhood of the target calls for no substantial variation. The expression "no substantial variation" as used herein means that such a practically discernible variation as is capable of positively varying the erosion pattern of a target is absent, although the plasma distribution in the neighborhood of the target is found by exact measurement to be discernibly varied by the application of the auxiliary magnetic field. The auxiliary magnetic field supply means brings about substantially no variation in the amount of plasma in the neighborhood of the target, though it affects the amount of plasma in the neighborhood of the surface of the material as described above. Thus, the auxiliary magnetic field supply means can be easily combined with the technique for enhancing the efficiency of utilization of the target. This invention, therefore, excels in freedom of design of the sputtering apparatus.

It has been heretofore customary to use as supplementary magnetic field supply means a permanent magnet which is capable of generating a strong magnetic field mainly in the immediate neighborhood and install the permanent magnet near the target. In contrast to the conventional apparatus described above, this invention beneficially uses such a auxiliary magnetic field supply means as an air-core electromagnetic coil which manifests a weak magnetic field intensity in the immediate neighborhood and is capable of supplying a magnetic field in a wide range. The position for setting the auxiliary magnetic field supply means in place may be separated from the target. The sputtering apparatus of this invention is clearly different in construction from the conventional apparatus described above.

In a concrete example of operating the sputtering apparatus illustrated in FIG. 1, an ITO thin film of compound was actually formed and tested for physical properties. The results of this test will be discussed hereinbelow. A sintered ITO piece was used as the target 51 and a glass substrate as the substrate 3 respectively in the apparatus.

First, the film forming vessel 1 was tightly sealed and evacuated by the discharge system 111 via the discharge system valve 112 until the internal pressure of the vessel 1 decreased to $2 \times 10^{-6}$ Torr. Then the Ar gas from the Ar gas supply system 101 was introduced at a flow volume of 172 sccm into the film forming vessel 1 via the conductance valve 102 until the total gas pressure inside the film forming vessel 1 reached $5 \times 10^{-3}$ Torr. To the interior of the film forming vessel 1, the $O_2$ gas from the reactive gas supply system 91 was introduced at a flow volume of 1 sccm via the conductance valve 92. This flow volume of $O_2$ gas is an important factor because it governs the quality of the ITO thin film in a large measure. For the apparatus of this example, 1 sccm is a smaller flow volume than usual and constitutes a condition of insufficient $O_2$ supply as compared with the optimum $O_2$ flow volume.

In the ensuant state of the apparatus, the electromagnet 8 was connected to the DC power source 7 and the auxiliary magnetic field was applied in the direction from the substrate 3 to the magnetron sputtering source 5. As a result, the parallel magnetic field $B_h$ on the surface of the substrate 3 was moved in the direction of the inside of the substrate 3. Then, the conditioning of the target 51 surface was effected by exciting the DC magnetron plasma with the shutter 4 kept in the shut state.

Thereafter, the shutter 4 was opened to introduce sputtering particles toward the substrate 3 and effect formation of a film thereon for seven minutes. Thus, the ITO thin film was formed on the substrate 3. The ITO thin film thus produced will be referred to as A hereinafter. For the purpose of comparison with this invention, an ITO thin film was obtained by following the process used for the formation of the ITO thin film A while omitting the application of the auxiliary magnetic field. This ITO thin film will be referred to hereinafter as B.

The sputtering apparatus of this embodiment was tested for intensity of magnetic field. The test results indicate that the parallel magnetic field $B_h$ assumed a position 5.1 cm from the center of the substrate as shown in FIG. 2 in the absence of the application of the auxiliary magnetic field and it was moved by the application of the auxiliary magnetic field to a position 1.5 cm from the center of the substrate, with the direction thereof kept unchanged.

On the theory that the amount of the plasma which flows into the glass substrate (hereinafter referred to as "amount of plasma inflow") is a magnitude proportional to the product of floating potential multiplied by ion current density to be obtained by the actual plasma measurement in accordance with the probe method, it is found that the product of floating potential multiplied by ion current density in the sole application of the main magnetic field is 78 mW/cm² in the central part of the substrate and 127 mW/cm² in the peripheral part 9.0 cm from the central part as shown in FIG. 5. This contrast of the two magnitudes implies very serious non-uniformity of the plasma distribution. When the auxiliary magnetic field is applied, however, the products are changed respectively to 130 mW/cm² and 140 mW/cm². The contrast of these magnitudes implies a notable decrease in the non-uniformity of plasma distribution within the surface. It has been ascertained that this improvement is obtained with notably exalted repeatability so long as the flow volume of $O_2$ gas is set at a level in the range of 0.30 to 0.86% of the total flow volume of sputtering gas.

Figure 6:
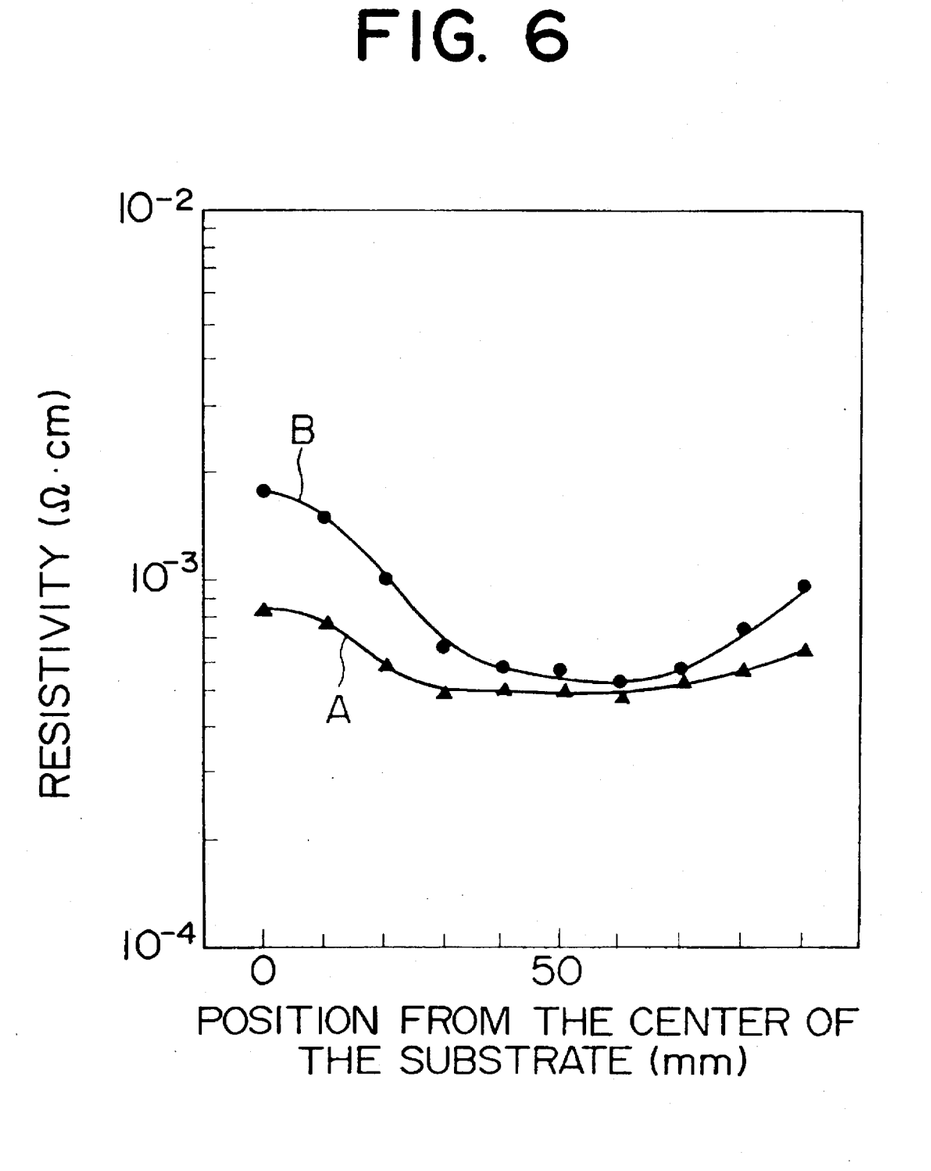
FIG. 6 is a characteristic diagram showing the resistivity distribution of an ITO thin film formed by the use of a sputtering apparatus as the first embodiment of this invention in comparison with that obtained in a comparative experiment.

The ITO thin films A and B obtained as described above were tested for resistivity distribution based on the position from the center of the substrate. The results of this test are shown in FIG. 6. It is clearly noted from FIG. 6 that an ITO thin film of excellent quality is obtained on a large surface area with high repeatability when the formation of film is carried out in the presence of the application of the auxiliary magnetic field. This is because the inward movement of the position of the parallel magnetic field $B_h$ increases the amounts of plasma inflow in the central part and peripheral part of the substrate and the averaging of the amount of plasma on the surface of the substrate mends the non-uniform quality possibly observed in such a thin film of compound as the ITO thin film, for example. While the non-uniformity of the resistivity distribution in the ITO thin film can be eliminated by heating the substrate and elevating the film-forming temperature, the present invention produces a uniform film without requiring to heat the substrate and, as a consequence, allows use of a substrate which offers only low heat resistance. This fact gives rise to the advantage that a wider freedom is allowed for the selection of the substrate material. Further, the uniformization of quality of the ITO thin film and the lowering of resistance can be materialized by combining the heat treatment given to the substrate with the averaging of the amount of plasma on the surface of the substrate.

Now, the second concrete example of using the sputtering apparatus described above will be explained. In the process for the formation of the ITO thin film in the first concrete example described above, the flow volume of $O_2$ was changed from 1 sccm to 2 sccm and, at the same time, the auxiliary magnetic field generated by the auxiliary magnetic field supply means (electromagnet 8) was given a direction completely reversed from that in the first concrete example. For the apparatus used herein, the aforementioned magnitude of 2 sccm as the flow volume of $O_2$ constitutes a condition of excess $O_2$ in the formation of an ITO thin film as compared with the optimum flow volume of $O_2$. The formation of the ITO thin film was carried out by otherwise using the same conditions as used in the first concrete example.

During the formation of the ITO thin film under the conditions mentioned above, the apparatus was tested for magnetic field intensity. The results of this test indicate that the parallel magnetic field $B_h$ assumed a position 5.1 cm from the center of the substrate in the absence of the application of the auxiliary magnetic field and it was moved to a position 4.0 cm outside of the substrate by the application of the auxiliary magnetic field. The apparatus was then tested for the amount of plasma inflow to the surface of the substrate. The results of this test indicate that the amount of plasma inflow was notably non-uniform relative to the position from the center of the substrate when the application of the auxiliary magnetic field was absent and this conspicuous non-uniformity was repressed to a slight fluctuation within ±several mW/cm² by the application of the auxiliary magnetic field. It has been ascertained further that these favorable results are obtained with high repeatability so long as the flow volume of the $O_2$ gas is set at a level in the range of 0.87 to 1.71% of the whole flow volume of sputtering gas.

Figure 7:
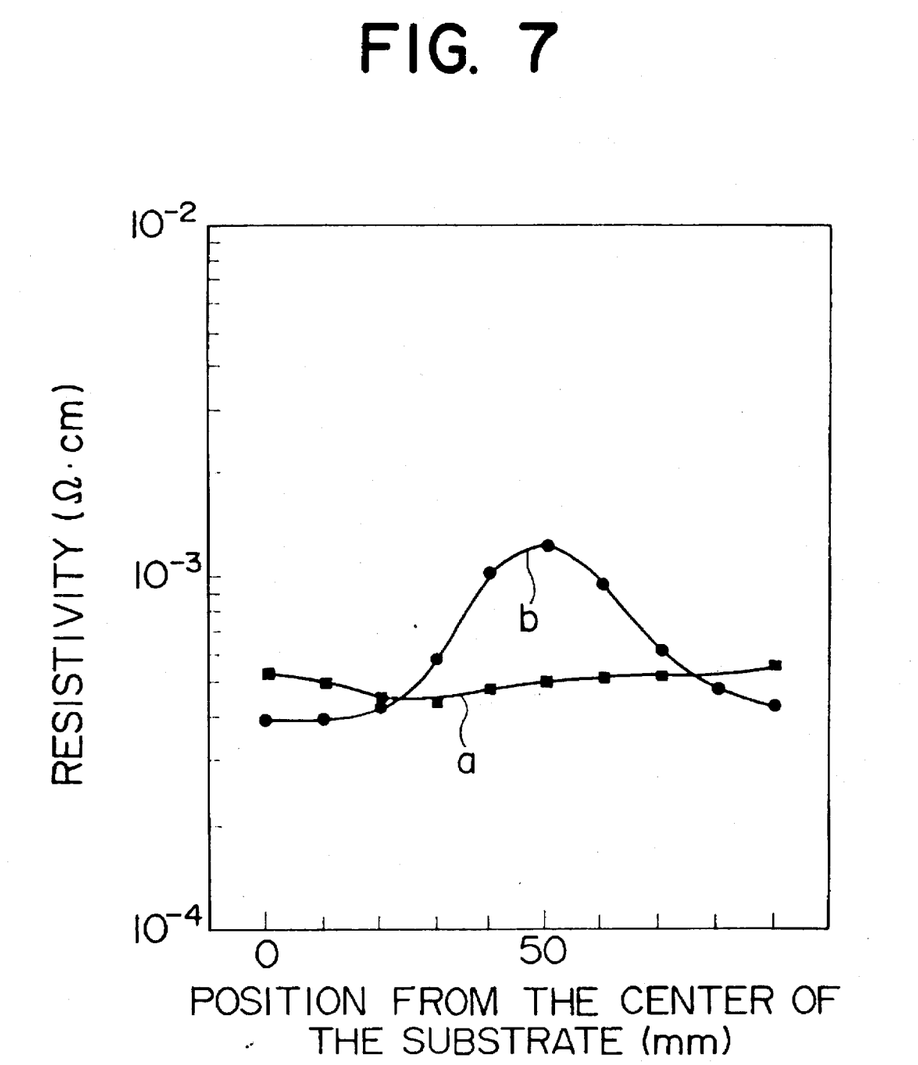
FIG. 7 is a characteristic diagram showing the resistivity distribution of another ITO thin film formed by the use of the sputtering apparatus as the first embodiment of this invention in comparison with that obtained in a comparative experiment.

FIG. 7 shows the results of a test conducted on the ITO thin film formed in the second concrete example with respect to the relation between the position from the center of the substrate and the resistivity. The ITO thin film formed with the position of the parallel magnetic field $B_h$ moved outwardly is designated as a and the ITO thin film for comparison formed under the same conditions except for omission of the application of the auxiliary magnetic field is designated as b. It is clearly noted from FIG. 7 that in the case of the state of $O_2$ excess (flow volume of $O_2$: 2 sccm), the unusually large amount of plasma inflow in the neighborhood of the intermediate between the central part and peripheral part of the substrate (5.1 cm from the center) was decreased by outwardly moving the position of the parallel magnetic field $B_h$ and the non-uniformity of quality of the thin film of compound was eliminated and the ITO thin film having the resistivity distribution uniformized throughout a large surface area was produced by averaging the amount of plasma on the surface of the substrate. Thus, the thin film of compound of excellent quality is formed on a large surface area with as high repeatability as in the first concrete example.

An elaborate review of the results of the two concrete examples cited above reveals that the following measures yield still better outcomes.

(1) The position at which the amount of plasma inflow is maximized coincides with the position of the parallel magnetic field $B_h$. The thin film of compound is obtained with constant or uniform quality, therefore, as by connecting an AC power source to the electromagnet thereby generating an AC magnetic field and varying the distribution of the amount of plasma inflow to the substrate along the course of time thereby rendering constant the sums of the amounts of plasma inflow at all the positions on the substrate within the duration of the sputtering work.

(2) Since the resistivity of the ITO thin film is sensitive as much to the flow volume of $O_2$ as when the magnetic field is generated exclusively by the main magnetic field supply means fulfilling the role of exciting the magnetron discharge, the uniformity of the thin film to be produced is further improved by keeping the flow volume of $O_2$ within a fixed range. To be more specific, it is desirable to set the flow volume of $O_2$ gas at a level in the range of 0.30 to 1.71% of the total flow volume of the sputtering gas. The thin film is not easily obtained with high repeatability by exclusively relying on the control of the flow volume of $O_2$. By designing the apparatus as by devising the shape of the gas inlet port so as to blow the $O_2$ in the form of shower onto the substrate and ensure uniform supply of $O_2$ to all the positions on the substrate, therefore, the repeatability with which the thin film is formed is improved even when the flow volume of $O_2$ is fluctuated to a certain extent.

(3) The thin film of compound to be formed does not need to be limited to ITO. The sputtering apparatus of this invention can be expected to produce the same effect on other transparent electroconductive substance like tin oxide or zinc oxide as on the ITO. The same effect can be expected to be obtained on oxides, nitrides, and sulfides of metals and semiconductors as on the ITO.

Now, the second embodiment of the sputtering apparatus of this invention will be described below with reference to FIG. 8 and FIG. 9. In the sputtering apparatus of the present embodiment, the electromagnet (air-core coil) 8 which constitutes auxiliary magnetic field supply means is isolated from the interior of the film forming vessel 1 by a vacuum seal 14. As illustrated specifically in FIG. 9, the electromagnet 8 which is connected to the AC power source or DC power source 7 is set in place inside the vacuum seal 14 made of a nonmagnetic material as stainless steel and Al. By the electric current applied to the electromagnet 8, the direction and intensity of the magnetic field generated by the auxiliary magnetic field supply means is freely varied. In the vacuum seal 14, a water-cooling mechanism 15 intended to cool the electromagnet 8 is set in place as shown in FIG. 9. In all the other respects, the construction of the sputtering apparatus in this embodiment is identical with that of the first embodiment described above.

The concentration of impurities in the discharge space can be decreased by isolating with an intervening wall of vacuum the electromagnet 8 as the auxiliary magnetic field supply means from the interior of the film forming vessel 1 which constitutes an discharge space as described above.

The interposition of the vacuum seal 14 is required for the purpose of precluding the possibility that the direct exposure of the electromagnet 8, ie. the auxiliary magnetic field supply means, to the interior of the film forming vessel 1 will increase the concentration of impurities in the plasma as by the inevitable inclusion therein of the gas discharged from the electromagnet 8 and consequently heighten the concentration of impurities in the thin film formed by the sputtering. Further, when the auxiliary magnetic field supply means is vacuum sealed, it is rendered possible to cool the auxiliary magnetic field supply means itself as with cold water. When the electromagnet 8 is used as the auxiliary magnetic field supply means, therefore, the electric current to be applied can be further increased without a change in the design of the electromagnet 8 because the heat generated by the electromagnet 8 is repressed. Since this increase in the electric current results in an addition to the freedom allowed for the selection of the auxiliary magnetic field to be used for application, the distribution of the amount of plasma inflow to the substrate 3 can be varied to a greater extent and the ability of the apparatus to control the discharge distribution can be exalted in a larger measure.

Figure 8:
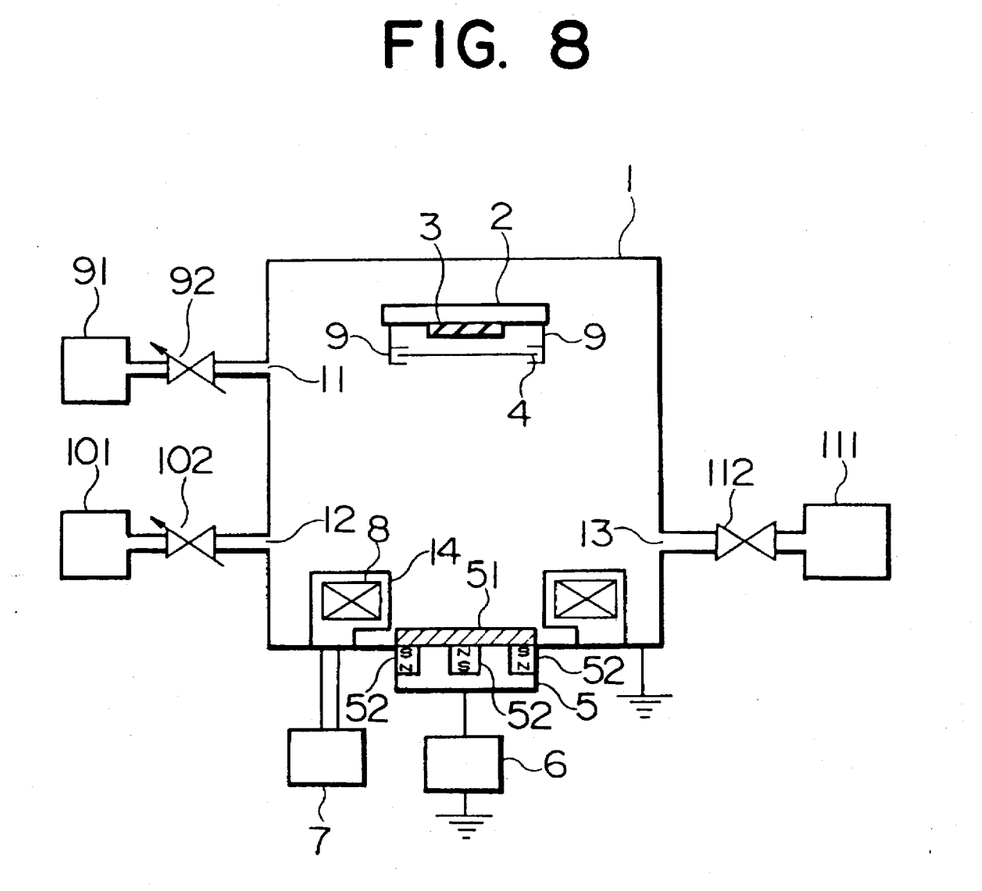
FIG. 8 is a cross section illustrating schematically the construction of a sputtering apparatus as a second embodiment of this invention.
Figure 9:
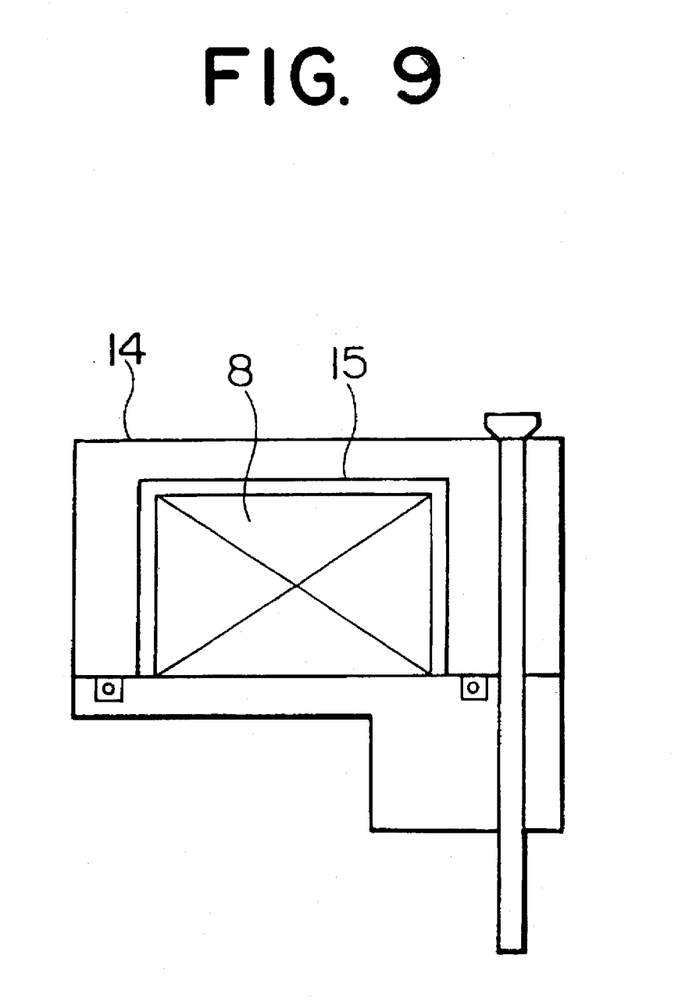
FIG. 9 is a diagram illustrating the construction of the essential part of the sputtering apparatus shown in FIG. 8.

Now, as a concrete example of using the sputtering apparatus illustrated in FIG. 8, an ITO thin film of compound was actually formed and the film was tested for physical properties. The results of this test will be discussed hereinbelow. In the apparatus, a ITO sinter was used as the target 51 and a glass substrate was used as the substrate 3.

First, the film forming vessel 1 was tightly sealed and evacuated by the discharge system 11 via the discharge system valve 112 until the pressure in the film forming vessel 1 decreased to $2 \times 10^{-6}$ Torr. Then, from the Ar gas supply system 101, the Ar gas was supplied at a flow volume of 172 sccm into the film forming vessel 1 through the medium of the conductance valve 102 until the total gas pressure in the vessel 1 reached $5 \times 10^{-6}$ Torr. Into the vessel 1, $O_2$ gas from the reactive gas supply system 91 was introduced at a flow volume of 1 sccm through the medium of the conductance valve 92.

With the apparatus in the ensuant state, the DC power source 7 was connected to the electromagnet 8 and the auxiliary magnetic field was applied to move the parallel magnetic field $B_h$ on the surface of the substrate 3 in the direction of the inside of the substrate 3. Then, the surface of the target 51 was conditioned by exciting the DC magnetron plasma with the shutter 4 kept in the shut state. Thereafter, the shutter 4 was opened to guide the sputtering particles toward the substrate 3, allow formation of a film to continue for seven minutes, and produced an ITO thin film on the substrate 3. The ITO thin film thus obtained is designated as C.

The ITO thin film C obtained as described above and the ITO thin film A obtained in the first embodiment cited above were analyzed for composition. The results of this test indicate that the ITO thin film C showed a smaller concentration of impurities and better repeatability of analysis than the other ITO thin film A.

The embodiments cited above have clearly demonstrated the effect of providing the auxiliary magnetic field supply means for the control of the amount of plasma flowing into the substrate in addition to the main magnetic field supply means and the effect of vacuum isolating the auxiliary magnetic field supply means from the film forming vessel. Now, a third embodiment of applying an improved version of the technique of this invention to a magnetron sputtering source of the multi-ring cathode type will be disclosed hereinbelow.

The multi-ring cathode type magnetron sputtering source is composed of a plurality of magnetron sputtering sources serving severally to retain a target and together assuming the form of concentric rings or rectangular rings and it is intended to uniformize, even in the operation of the stationary opposition type sputtering method, the distribution of thickness of the thin film to be formed on the substrate opposed to the target as by devising the dimensions of the individual sputtering sources or the relative disposition of the sputtering sources or enabling the sputtering sources to be supplied independently of electric power. In the present embodiment, the auxiliary magnetic field supply means contemplated by this invention for the control of the distribution of magnetron plasma are disposed between the adjacent multi-ring cathode type magnetron sputtering sources.

Figure 10:
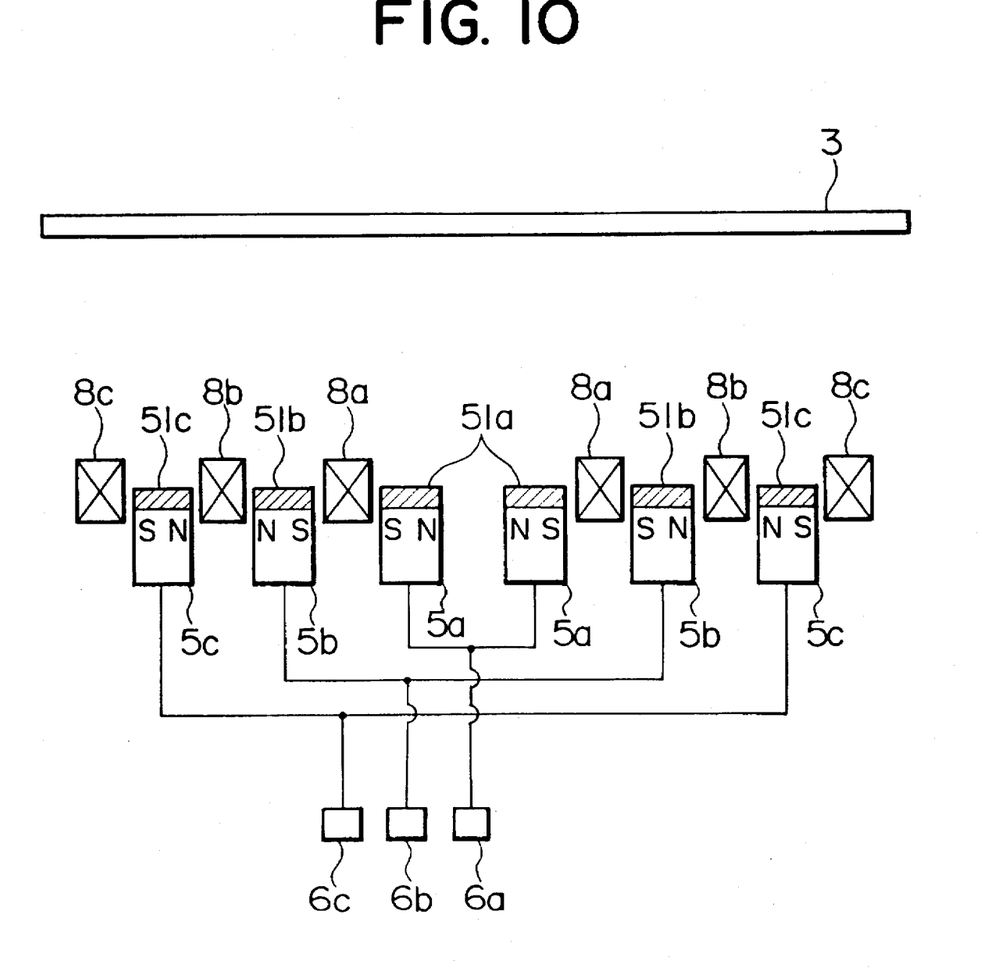
FIG. 10 is a cross section illustrating schematically the construction of a sputtering apparatus as a third embodiment of this invention.

FIG. 10 schematically illustrates the relative layout of magnetron sputtering sources and a substrate in the sputtering apparatus of the present embodiment. In FIG. 10, 51a, 51b, and 51c stand for concentrically annular targets, 5a, 5b, and 5c for concentrically annular multi-ring cathode type magnetron sputtering sources respectively retaining the targets 51a, 51b, and 51c, 8a, 8b, and 8c for concentrically annular electromagnets fulfilling the function of auxiliary magnetic field supply means for controlling the plasma distribution, 6a, 6b, and 6c for electric sources for injecting electric power respectively to the multi-ring cathode type magnetron sputtering sources 5a, 5b, and 5c, and 3 for a substrate disposed as opposed to the components mentioned above. In the concentrically annular multi-ring cathode type magnetron sputtering sources 5a, 5b, and 5c, main magnetic field supply means (indicated by NS) adapted to excite magnetron discharge are so laid out as to invert the polarities thereof alternately from one to the other of adjacent ring cathodes. The alternate inversion of polarities is aimed at exalting the intensity of parallel magnetic fields parallel to the surfaces of the targets 51a, 51b, and 51c which are generated on the surfaces of the targets 51a, 51b, and 51c. The polarity arrangement of the main magnetic field means is not particularly limited. The directions of the auxiliary magnetic fields for the control of the plasma distribution, however, are to be decided in accordance with the directions of the main magnetic fields as described more specifically hereinbelow. The electromagnets 8a, 8b, and 8c functioning as auxiliary magnetic field supply means for the control of the plasma distribution are desired to be vacuum sealed with a nonmagnetic material represented by stainless steel and Al similarly to the countertypes of the embodiment cited above so as to be isolated from the film forming vessel, though these vacuum seals are not clearly shown in FIG. 10 to avoid complicating illustration.

By the use of the sputtering apparatus constructed as described above, the formation of a thin film was carried out as follows. First, Ar and $O_2$ gases were introduced as mixed at a prescribed flow volume ratio into the film forming vessel housing the aforementioned components laid out as described above. Then, the discharge system was operated to set the gas pressure in the film forming apparatus at a prescribed level. Thereafter, the power sources 6a, 6b, and 6c were used to inject electric power at a prescribed power ratio to the multi-ring cathode type magnetron sputtering sources 5a, 5b, and 5c and excite magnetron plasma.

The expression "prescribed ratio" of the electric power for injection into the multi-ring cathode type magnetron sputtering sources 5a, 5b, and 5c as used herein means such a power ratio as is required for forming a uniform film thickness distribution within a prescribed area of the substrate 3. Actually, this power ratio is so set that the power density per unit surface area of target increases in the direction from the innermost to the outermost ring cathodes. In this case, the thin films which are formed severally for the targets 51a, 51b, and 51c assume ununiform film thickness distributions of the approximate shape of a Gaussian curve which peak directly above the targets 51a, 51b, and 51c. By injecting electric power at an appropriate power injection ratio to the multi-ring cathode type magnetron sputtering sources 5a, 5b, and 5c, however, the Gaussian distributions are caused to overlap properly each other and give rise to a uniform film thickness distribution over a wide area of the substrate 3.

At the same time that the plasma is formed, the plasma distribution is controlled by feeding a proper electric current to the electromagnets 8a, 8b, and 8c fulfilling the role of controlling the plasma distribution. In the atmosphere in which the proportion of oxygen is relatively large in the total sputtering gas being introduced, for example, it is desirable to lower the amount of plasma flowing into the substrate 3 surface in the same manner as in the concrete example cited above. When the main magnetic field supply means are laid out as illustrated in FIG. 10, therefore, the magnetron plasma distribution on the target 51a is controlled in the outward direction by causing the electromagnet 8a to generate auxiliary magnetic fields in the downward direction, the magnetron plasma distribution on the target 51b is controlled in the outward direction by causing the electromagnet 8b to generate auxiliary magnetic fields in the upward direction, and the magnetron plasma on the target 51c is controlled in the outward direction by causing the electromagnet 8c to generate auxiliary magnetic fields in the downward direction. In the present embodiment, the substrate 3 was kept at rest during the formation of a thin film for the purpose of demonstrating the effect of the invention.

The ITO thin film was formed by following the procedure described above. This ITO thin film showed a substantially uniform film thickness distribution having fluctuation within ±5% and, at the same time, a substantially uniform resistivity having fluctuation within ±5%. In the ITO thin film which was formed for the sake of comparison with this invention by similarly using the multi-ring cathode type magnetron sputtering sources 5a, 5b, and 5c while omitting the operation of the electromagnets 8a, 8b, and 8c as auxiliary magnetic field supply means, the film thickness distribution was as uniform as in the embodiment cited above and the resistivity distribution fluctuated heavily to the extent of ±30%.

In the present embodiment, owing to the combined use of the multi-ring cathode type magnetron sputtering sources and the auxiliary magnetic field supply means for the control of magnetron plasma, the formation of a thin film uniform both in thickness and resistivity on a large surface area is realized by the stationary opposition type sputtering method as described above. As a result, the manufacture of large apparatuss is rendered feasible by the use of the stationary opposition sheet type sputtering apparatus which entails only low cost of equipment, occupies a small floor area, uses only a small number of drive parts, permits easy maintenance, and calls for a low process cost.

The embodiments cited thus far represent cases of applying this invention to sputtering apparatuss having target surfaces and substrate surfaces disposed in substantially parallel to each other. This invention does not particularly discriminate the sputtering apparatus on account of the relative layout of the target and the substrate. Even when the target and the substrate are so disposed that their surfaces are oblique or perpendicular to each other, this invention operates effectively. The target does not need to be a flat plate. Even when the target to be used is in the shape of a truncated cone or a bar, for example, this invention can be effectively applied.

Figure 11:
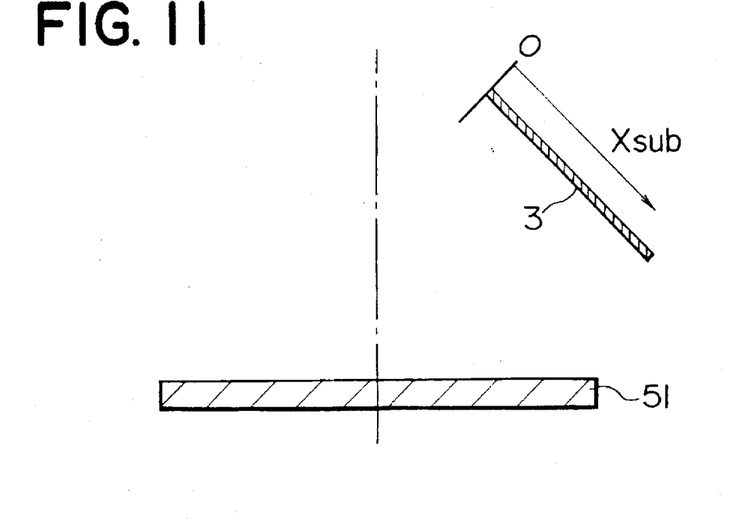
FIG. 11 is a cross section illustrating schematically the layout construction of a substrate and a target in a sputtering apparatus as a fourth embodiment of this invention.

Now, the fourth embodiment having a substrate so disposed that the surface thereof is oblique to the surface of a target will be described below. FIG. 11 is a diagram schematically illustrating the relative layout of a substrate 3 and a target 51 in the present embodiment. The substrate 3 is disposed as inclined at an angle of 45 degrees relative to the target 51. In all the other respects, the construction of this apparatus is identical with that of the sputtering apparatus illustrated in FIG. 1.

Figure 12:
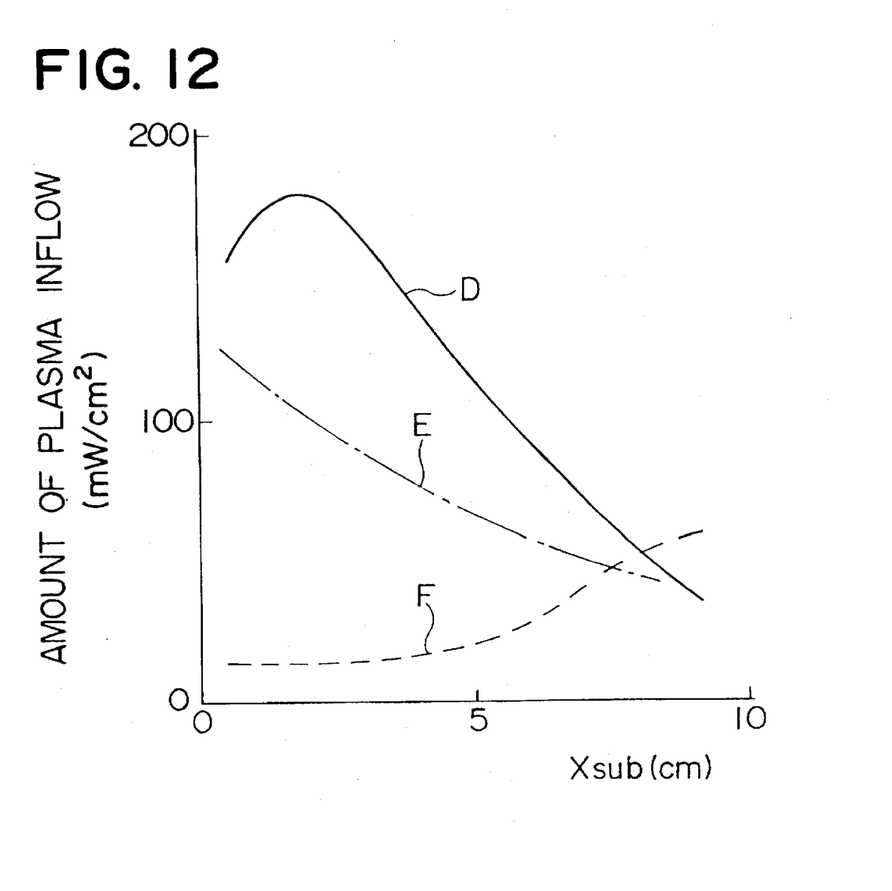
FIG. 12 is a diagram showing the relation between the amount of plasma flowing into a substrate in the sputtering apparatus of FIG. 11 using a main magnetic field and an auxiliary magnetic field and the position of inflow of plasma from the terminal part of the substrate in comparison with that obtained in the apparatus solely using a main magnetic field.

The sputtering apparatus of this construction was used to determine the distribution of the amount of plasma inflow to the substrate 3 surface in an operation solely using a main magnetic field, the distribution of the amount of plasma inflow to the substrate 3 surface in an operation using an auxiliary magnetic field so as to move a parallel magnetic field parallel to the target surface toward the inside of the target, and the distribution of the amount of plasma inflow to the substrate 3 surface in an operation using the auxiliary magnetic field so as to move a parallel magnetic field parallel to the target surface toward the outside of the target. The graph obtained by plotting the results of this determination is shown in FIG. 12. In this diagram, the horizontal axis is the scale of the distance ($X_{sub}$) of the site of inflow from the upper end part of the substrate. In FIG. 12, the line D represents the data obtained in the operation solely using the main magnetic field, the line E the data obtained in the operation using the auxiliary magnetic field so as to move the magnetic field toward the inside of the target, and the line F the data obtained in the operation using the auxiliary magnetic field so as to move the magnetic field toward the outside of the target.

It is clearly noted from FIG. 12 that even when the substrate and the target are so laid out that their surfaces are oblique to each other, the amount of plasma inflow to the substrate surface can be averaged and the thin film to be formed is consequently allowed to acquire uniform quality by applying the auxiliary magnetic field so as to move suitably the position of the parallel magnetic field parallel to the target surface.

The embodiments cited thus far clearly demonstrate that in accordance with the present invention, the amount of plasma on the surface of the substrate can be averaged, the lack of uniformity of the quality as observed in the thin film of compound can be eliminated, the thin film of excellent quality can be formed with high repeatability on a large surface area by a relatively simple process of applying an auxiliary magnetic field so as to lower the spatially dispersed amount of magnetron plasma.

What is claimed is:

1. A method for sputtering, comprising the steps of:
    disposing inside a film forming vessel a target and a material on which a film formed of a substance of said target is to be formed, the vessel having a gas supply system and a discharge system communicating with each other;
    forming in the interior of said film forming vessel a gas atmosphere;
    supplying an electric field and a main magnetic field in the neighborhood of said target thereby inducing generation of magnetron plasma in the neighborhood of said target in the interior of said film forming vessel; and
    supplying from a location closer to the target than to the material a sufficiently weak auxiliary magnetic field so that substantial distribution of said main magnetic field is not varied in the neighborhood of said target in the interior of said film forming vessel thereby decreasing a spatially dispersed amount of said magnetron plasma diffused from the neighborhood of said target to the neighborhood of a surface of said material by varying distribution of said main magnetic field in the neighborhood of said material surface.

2. A method according to claim 1, wherein said auxiliary magnetic field is utilized for moving a magnetic field parallel to the surface of said target generated by supplying said main magnetic field in a direction parallel to said target surface.

3. A method according to claim 1, wherein an electromagnet is utilized for supplying said auxiliary magnetic field.

4. A method according to claim 1, wherein said film to be formed is a film of compound.

5. A method according to claim 1, wherein the step of supplying a sufficiently weak auxiliary magnetic field includes forming a magnetic field manifesting a weak magnetic field intensity in the neighborhood of an auxiliary magnetic field generating device and having a magnetic field wider in range than the main magnetic field.

6. A method according to claim 1, wherein the step of supplying a sufficiently weak auxiliary magnetic field includes varying a direction and intensity of the auxiliary magnetic field.

7. A method according to claim 1, including isolating an auxiliary magnetic field supply means from atmosphere in the film forming vessel via a vacuum seal.

8. A method according to claim 7, wherein the vacuum seal includes a nonmagnetic material.

9. A method according to claim 1, including integrating electric field supply means and main magnetic field supply means to form a magnetron sputtering source.

10. A method according to claim 1, including integrating electric field supply means and main magnetic field supply means to form magnetron sputtering sources arranged in concentric rings or rectangular rings.

11. A method according to claim 10, including interposing auxiliary magnetic field supply means between said magnetron sputtering sources.

12. A method according to claim 1, further comprising supplying said auxiliary magnetic field from an air-core coil.

* * * * *